United States Patent
Lee et al.

(10) Patent No.: US 12,342,605 B2
(45) Date of Patent: Jun. 24, 2025

(54) SEMICONDUCTOR DEVICE WITH FIN STRUCTURES

(71) Applicant: Taiwan Semiconductor Manufacturing Company, Ltd., Hsinchu (TW)

(72) Inventors: Kun-Yu Lee, Tainan (TW); Chunyao Wang, Zhubei (TW); Chi On Chui, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 18/318,195

(22) Filed: May 16, 2023

(65) Prior Publication Data
US 2023/0282521 A1    Sep. 7, 2023

Related U.S. Application Data

(62) Division of application No. 17/350,282, filed on Jun. 17, 2021, now Pat. No. 11,688,645.

(51) Int. Cl.
*H10D 84/03* (2025.01)
*H01L 21/02* (2006.01)
(Continued)

(52) U.S. Cl.
CPC ..... *H10D 84/038* (2025.01); *H01L 21/02356* (2013.01); *H01L 21/76224* (2013.01); *H10D 84/0151* (2025.01); *H10D 84/834* (2025.01); *H01L 21/0214* (2013.01); *H01L 21/02148* (2013.01); *H01L 21/02164* (2013.01); *H01L 21/0217* (2013.01); *H01L 21/02181* (2013.01); (Continued)

(58) Field of Classification Search
CPC ....... H01L 21/823481; H01L 21/76224; H01L 29/6681; H01L 21/02356; H10D 84/0151; H10D 30/0243
See application file for complete search history.

(56) References Cited

U.S. PATENT DOCUMENTS 8,836,016 B2    9/2014    Wu et al.
8,841,701 B2    9/2014    Lin et al.
(Continued)

OTHER PUBLICATIONS

Fischer et al. "Ab initio study of high permittivity phase stabilization in HfSiO", Microelectronic Engineering 84 (2007) 2039-2042. (Year: 2007).

*Primary Examiner* — Sonya McCall-Shepard
(74) *Attorney, Agent, or Firm* — McClure, Qualey & Rodack, LLP

(57) ABSTRACT

A semiconductor device structure is provided. The semiconductor device structure includes a first fin structure and a second fin structure over a semiconductor substrate and a first epitaxial structure over the first fin structure. The semiconductor device structure also includes a second epitaxial structure over the second fin structure. The semiconductor device structure further includes a dielectric fin over the semiconductor substrate. The dielectric fin is between the first fin structure and the second fin structure. The dielectric fin has an inner portion and a protective layer. The protective layer extends along sidewalls and a bottom of the inner portion, and the protective layer has a dielectric constant higher than that of the inner portion.

20 Claims, 12 Drawing Sheets

(51) Int. Cl.
*H01L 21/762* (2006.01)
*H10D 30/01* (2025.01)
*H10D 84/01* (2025.01)
*H10D 84/83* (2025.01)

(52) U.S. Cl.
CPC .. *H01L 21/02183* (2013.01); *H01L 21/02189* (2013.01); *H01L 21/02192* (2013.01); *H01L 21/02194* (2013.01); *H01L 21/022* (2013.01); *H01L 21/02271* (2013.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 11,120,997 B2 * | 9/2021 | Chen ............... H01L 21/76229 |
| 2015/0357439 A1 * | 12/2015 | Liu ............... H01L 21/823431 438/283 |
| 2019/0103304 A1 * | 4/2019 | Lin ............... H01L 29/66545 |
| 2019/0165127 A1 * | 5/2019 | Ching ............... H01L 21/76229 |
| 2019/0287972 A1 * | 9/2019 | Hafez ............... H01L 29/66795 |
| 2020/0328207 A1 | 10/2020 | Hong et al. |
| 2021/0159311 A1 * | 5/2021 | Lan ............... H01L 29/42376 |

* cited by examiner

SEMICONDUCTOR DEVICE WITH FIN STRUCTURES

PRIORITY CLAIM AND CROSS-REFERENCE

This Application is a Divisional of U.S. application Ser. No. 17/350,282, filed on Jun. 17, 2021 (now U.S. Pat. No. 11,688,645), the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
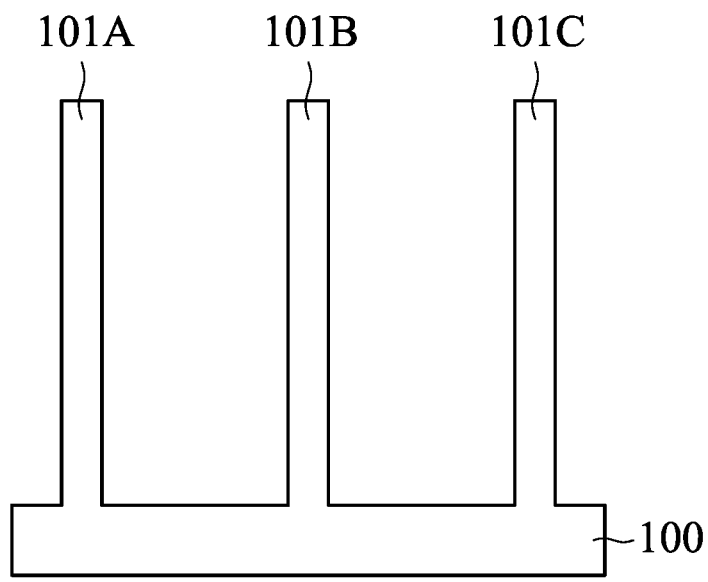
FIGS. 1A-1H are cross-sectional views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10° in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% in some embodiments. The term "about" in relation to a numerical value x may mean x ±5 or 10% in some embodiments.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1H are cross-sectional views of various stages of a process for forming a portion of a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer.

The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Another suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, multiple fin structures 101A, 101B, and 101C are formed over the semiconductor substrate 100, in accordance with some embodiments. In some embodiments, multiple recesses (or trenches) are formed in the semiconductor substrate 100, in accordance with some embodiments. As a result, multiple fin structures that protrude from the surface of the semiconductor substrate 100 are formed or defined between the recesses. In some embodiments, one or more photolithography and etching processes are used to form the recesses. In some embodiments, the fin structures 101A to 101C are in direct contact with the semiconductor substrate 100.

However, embodiments of the disclosure have many variations and/or modifications. In some other embodiments, the fin structures 101A to 101C are not in direct contact with the semiconductor substrate 100. One or more other material layers may be formed between the semiconductor substrate 100 and the fin structures 101A to 101C. For example, a dielectric layer may be formed therebetween.

Figure 1B:
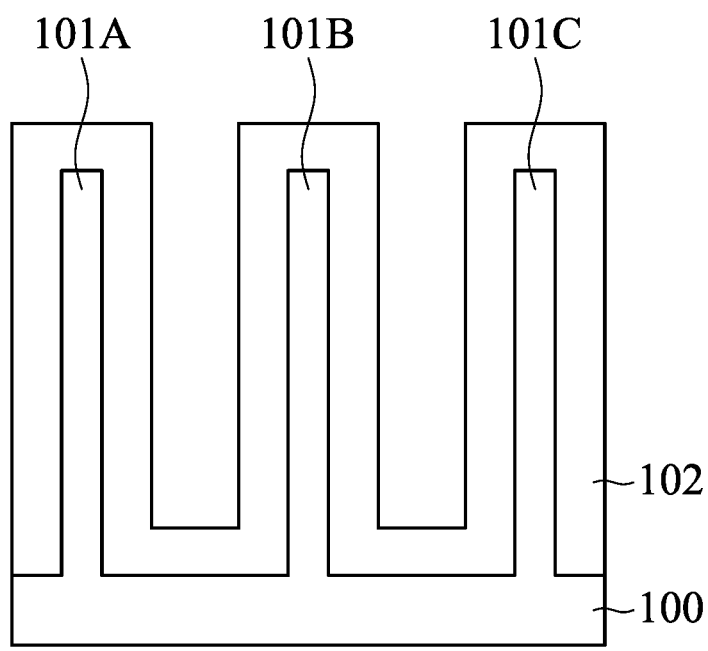

As shown in FIG. 1B, an isolation layer 102 is deposited over the semiconductor substrate 100 and the fin structures 101A to 101C, in accordance with some embodiments. In some embodiments, the isolation layer 102 extends along sidewalls and tops of the fin structures 101A to 101C. In some embodiments, the isolation layer 102 conformally extends along the fin structures 101A to 101C. In some embodiments, the isolation layer 102 is in direct contact with the fin structures 101A to 101C.

In some embodiments, the isolation layer 102 is made of or includes silicon oxide, silicon oxynitride, carbon-containing silicon oxide, one or more other suitable materials, or a combination thereof. The isolation layer 102 may be deposited using a chemical vapor deposition (CVD) process, an atomic layer deposition (ALD) process, a thermal oxidation process, one or more other applicable processes, or a combination thereof.

Figure 1C:
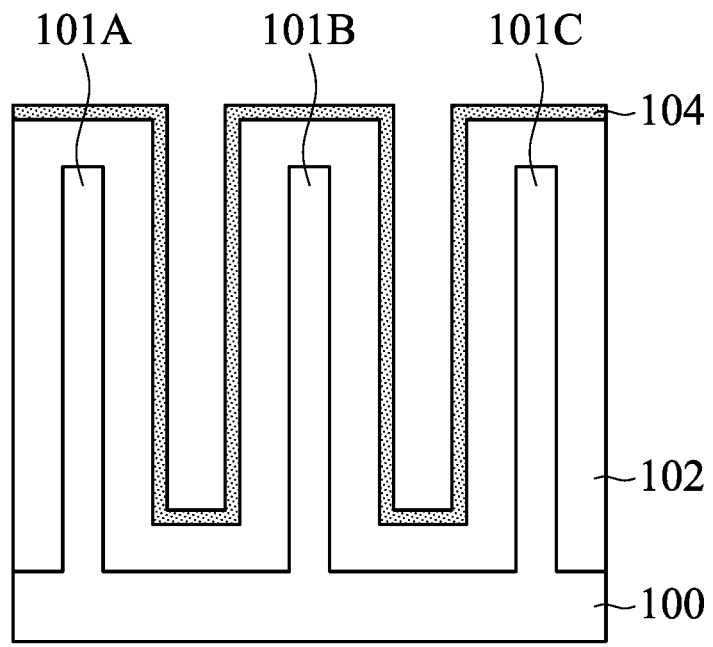

As shown in FIG. 1C, a protective layer 104 is deposited over the isolation layer 102, in accordance with some embodiments. In some embodiments, the protective layer 104 extends conformally along the isolation layer 102. In some embodiments, the protective layer 104 extends along sidewalls and tops of the fin structures 101A to 101C. In some embodiments, the protective layer 104 conformally extends along the fin structures 101A to 101C. In some embodiments, the protective layer 104 is in direct contact with the isolation layer 102.

In some embodiments, the protective layer 104 is made of or includes a high dielectric constant (high-k) material. The high-k material may include hafnium oxide, hafnium zirconium oxide, zirconium oxide, hafnium dioxide-alumina alloy, hafnium silicon oxide, hafnium silicon oxynitride, hafnium tantalum oxide, hafnium titanium oxide, lanthanum oxide, hafnium lanthanum oxide, one or more other suitable materials, or a combination thereof. The protective layer 104 may be deposited using an ALD process, a CVD process, one or more other applicable processes, or a combination thereof.

Figure 1D:
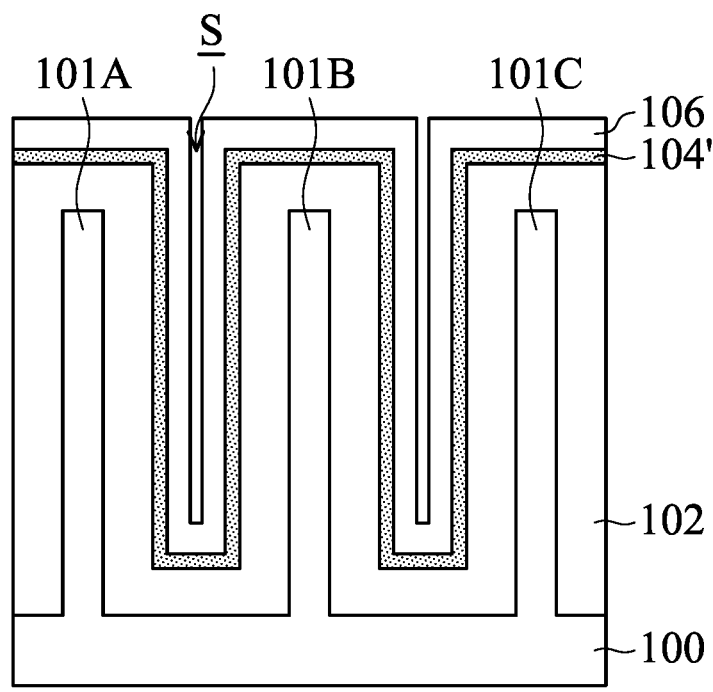

As shown in FIG. 1D, a dielectric layer 106 is deposited over the protective layer 104, in accordance with some embodiments. In some embodiments, the dielectric layer 106 extends conformally along the protective layer 104. In some embodiments, the dielectric layer 106 extends along sidewalls and tops of the fin structures 101A to 101C. In some embodiments, the dielectric layer 106 conformally extends along the fin structures 101A to 101C. In some embodiments, the dielectric layer 106 is in direct contact with the protective layer 104. In some embodiments, the dielectric layer 106 surrounds seams S, as shown in FIG. 1D.

In some embodiments, the dielectric layer 106 is made of or includes silicon nitride, silicon oxide, silicon oxynitride, carbon-containing silicon oxide, carbon-containing silicon oxynitride, one or more other suitable materials, or a combination thereof. The dielectric layer 106 may be deposited using an ALD process, a CVD process, one or more other applicable processes, or a combination thereof. In some embodiments, the deposition of the dielectric layer 106 involves a thermal operation. For example, the deposition of the dielectric layer 106 is performed at a high temperature that is in a range from about 450 degrees C. to about 550 degrees C.

In some embodiments, due to the thermal operation, the protective layer 104 is crystallized during the deposition of the dielectric layer 106. As a result, the protective layer 104 is crystallized to form a crystallized protective layer 104', as shown in FIG. 1D in accordance with some embodiments. The crystallized protective layer 104' may have a better etching resistance than the protective layer 104 that is not or merely slightly crystallized. The crystallized protective layer 104' may thus provide better protection to dielectric fins that will be formed later.

In some embodiments, the dielectric layer 106 is substantially not crystallized. The dielectric layer 106 may be amorphous or include a small amount of nanocrystals. The crystallized protective layer 104' may have a first average grain size, and the dielectric layer 106 may have a second average grain size. In some embodiments, the first average grain size is larger than the second average grain size.

Many variations and/or modifications can be made to embodiments of the disclosure. In some embodiments, one or more additional thermal operations are used to form the crystallized protective layer 104' and/or to enhance the crystallization of the crystallized protective layer 104'. The operation temperature of the thermal operations may be in a range from about 450 degrees C. to about 1000 degrees C. The operation time of the thermal operations may be in a range from about 1 second to about 1 hour.

The crystallized protective layer 104' has a first dielectric constant, and the dielectric layer 106 has a second dielectric constant. In some embodiments, the first dielectric constant is higher than the second dielectric constant. In some embodiments, the first dielectric constant is higher than about 14. In some embodiments, the first dielectric constant is higher than the dielectric constant of silicon nitride. In some embodiments, the first dielectric constant is higher than the dielectric constant of carbon-containing silicon nitride. In some embodiments, the first dielectric constant is higher than the dielectric constant of carbon-containing silicon oxynitride.

Figure 1E:
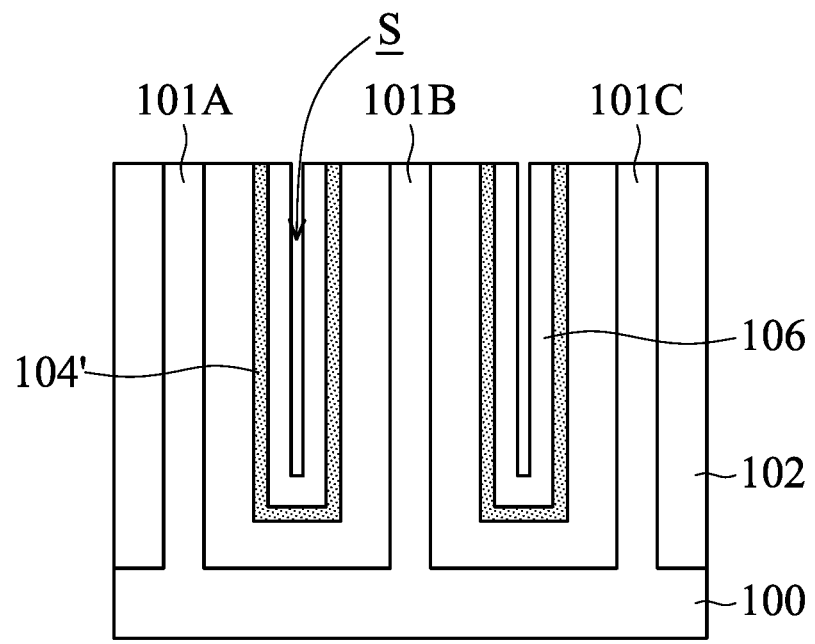

As shown in FIG. 1E, the dielectric layer 106, the crystallized protective layer 104', and the isolation layer 102 are partially removed, in accordance with some embodiments. As a result, the tops of the fin structures 101A to 101C that are originally covered by these layers are exposed, as shown in FIG. 1E. In some embodiments, the dielectric layer 106, the crystallized protective layer 104', and the isolation layer 102 are partially removed using a planarization process. The planarization process may include a chemical mechanical polishing (CMP) process, a grinding process, a dry polishing process, an etching process, one or more other applicable processes, or a combination thereof.

Figure 1F:
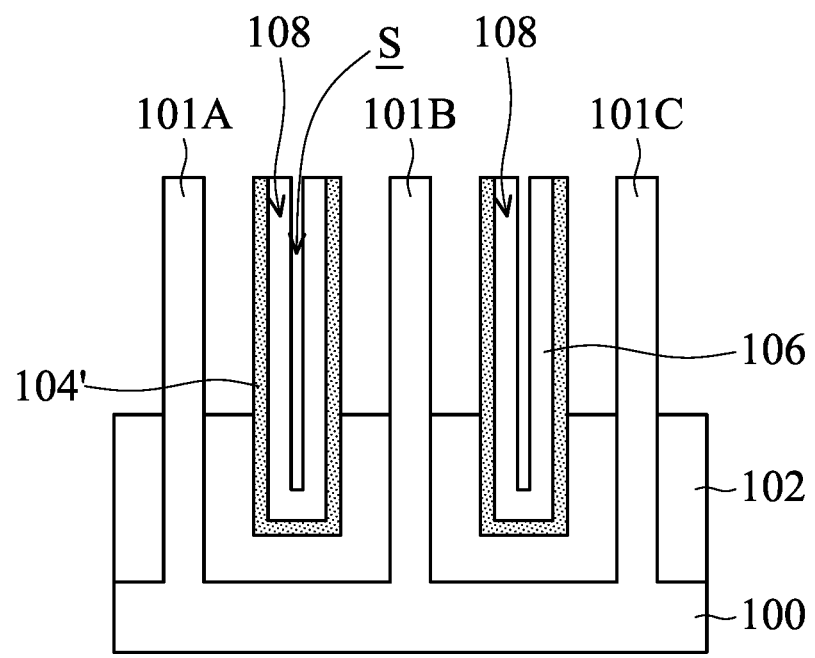

As shown in FIG. 1F, the isolation layer 102 is recessed, in accordance with some embodiments. The isolation layer 102 may be recessed using an etching back process. As a result, the remaining portion of the isolation layer 102 forms an isolation structure. The isolation structure (i.e., the isolation layer 102) laterally surrounds lower portions of the fin structures 101A to 101C, as shown in FIG. 1F. The reference number "102" may also be used to designate the isolation structure.

As shown in FIG. 1F, the remaining portions of the crystallized protective layer 104' and the dielectric layer 106 together form multiple dielectric fins 108. The isolation structure (i.e., the isolation layer 102) also laterally surrounds lower portions of the dielectric fins 108. Each of the fin structures 101A to 101C and each of the dielectric fins 108 protrude from the top surface of the isolation structure (i.e., the isolation layer 102). In some embodiments, in each of the dielectric fins 108, the seam S extends downwards from the top surface of the inner portion (i.e., the dielectric layer 106) to exceed the topmost surface of the isolation structure 102, as shown in FIG. 1F.

The crystallized protective layer 104' of the dielectric fin 108 may function as a protective shell that protects the inner portion of the dielectric fin 108. The inner portion of the dielectric fin 108 is a dielectric structure constructed by the dielectric layer 106. During a subsequent etching process, the crystallized protective layer 104' that has good etching resistance may protect the dielectric layer 106 from being damaged. Due to the blocking of the dielectric layer 106, voids are prevented from being formed in the crystallized protective layer 104'.

In some other cases where the dielectric layer 106 is not formed, the crystallization of the protective layer 104 may occur in accompany with grain growth. As a result, the seam S may be randomly merged into voids. These voids may result in the unexpected merging of nearby epitaxial structures. Alternatively, the voids may result in unexpected short circuiting between two portions of a gate stack that are designed to be electrically isolated from each other.

Figure 2A:
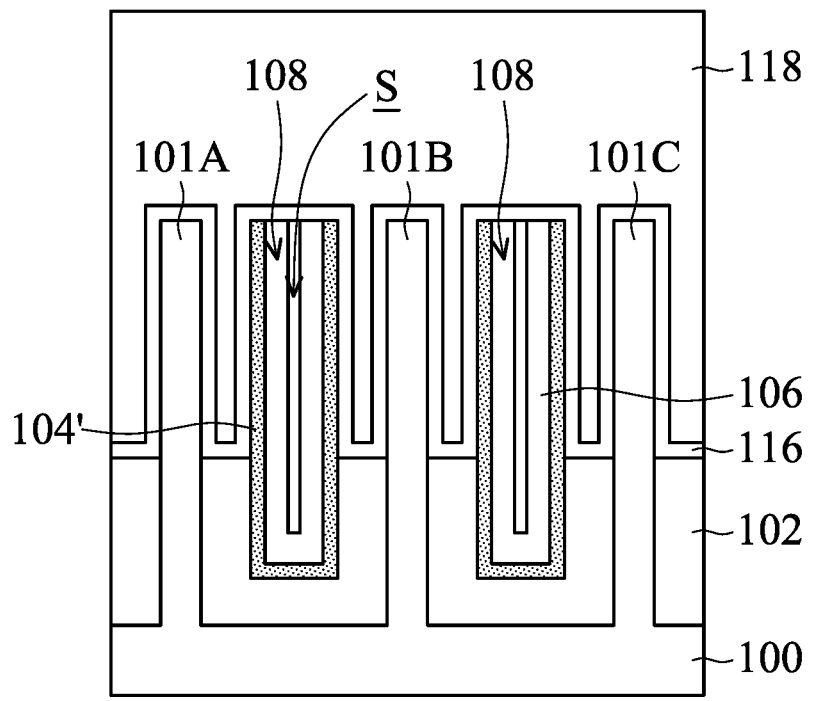
FIGS. 2A-2B are cross-sectional views of various stages of a process for forming a portion of a semiconductor device structure, in accordance with some embodiments.
Figure 2B:
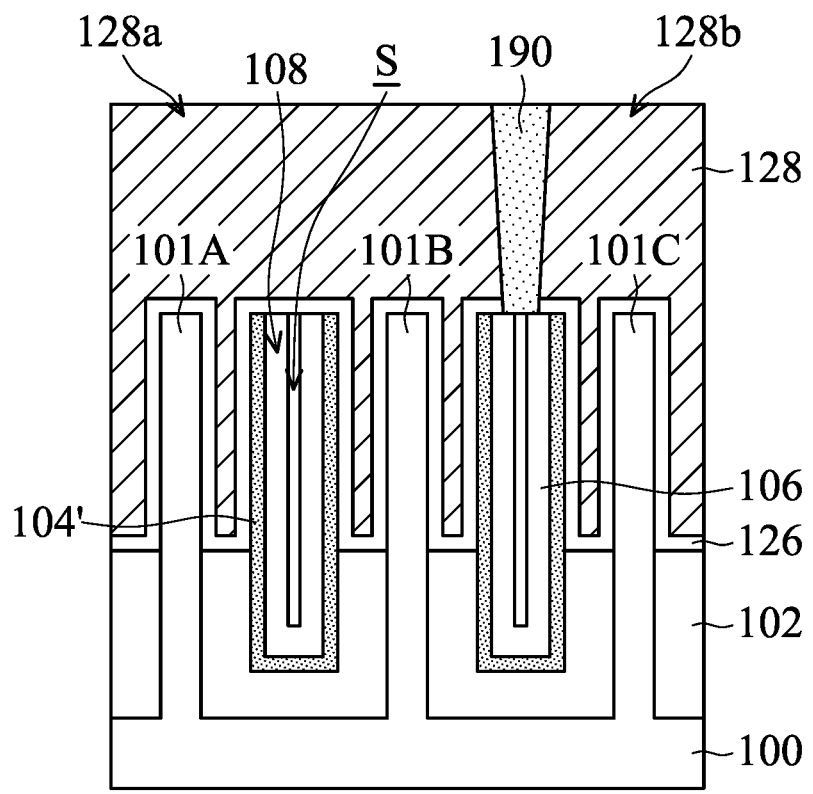

FIGS. 2A-2B are cross-sectional views of various stages of a process for forming a portion of a semiconductor device structure, in accordance with some embodiments. As shown in FIG. 2A, after the formation of the dielectric fins 108, a dummy gate stack is formed over the fin structures 101A to 101C and the dielectric fins 108, in accordance with some embodiments. The dummy gate stack is formed to partially cover and to extend across the fin structures 101A to 101C.

The dummy gate stack includes a dummy gate dielectric layer 116 and a dummy gate electrode 118. The dummy gate dielectric layer 116 may be made of or include silicon oxide. The dummy gate electrode 118 may be made of or include polysilicon. In some embodiments, a dummy gate dielectric material layer and a dummy gate electrode layer are sequentially deposited over the isolation structure 102, the fin structures 101A to 101C, and the dielectric fins 108. Afterwards, the dummy gate dielectric material layer and the dummy gate electrode layer are patterned to form the dummy gate stack.

Figure 1G:
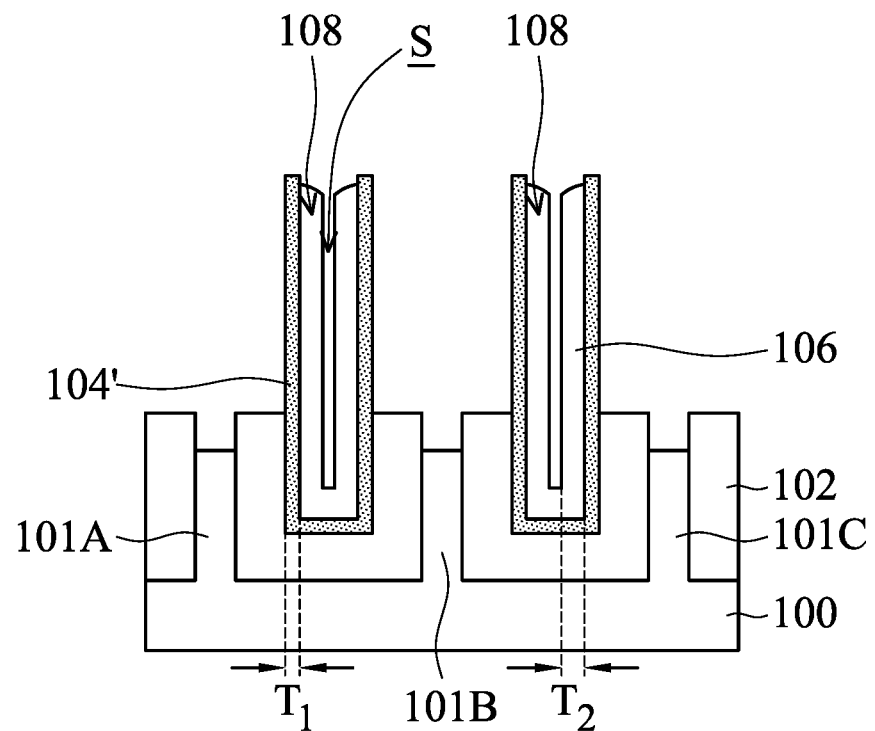

FIG. 1G shows the cross-sectional view of the portion of the semiconductor device structure that is not covered by the dummy gate stack. The cross-sectional view is taken along a line parallel to the longitudinal direction of the dummy gate stack but not overlapping the dummy gate stack.

As shown in FIG. 1G, after the formation of the dummy gate stack as illustrated in FIG. 2A, the exposed portions of the fin structures 101A to 101C are partially removed, in accordance with some embodiments. The fin structures 101A to 101C may be recessed using one or more etching processes. In some embodiments, after the recessing, the top surfaces of the fin structures 101A to 101C are lower than the top surface of the isolation structure 102.

In some embodiments, the dielectric layer 106 of the dielectric fin 108 is slightly etched during the recessing of the fin structures 101A to 101C. In some embodiments, the topmost surface of the inner portion (i.e., the dielectric layer 106) of the dielectric fin 108 is closer to the semiconductor substrate 100 than the topmost surface of the crystallized protective layer 104' (that functions as a protective shell) of the dielectric fin 108. In some embodiments, the topmost surface of the inner portion (i.e., the dielectric layer 106) has a curved profile.

As shown in FIG. 1G, the crystallized protective layer 104' has a film thickness $T_1$, and the dielectric layer 106 has a film thickness $T_2$. In some embodiments, the film thickness $T_1$ of the crystallized protective layer 104' is in a range from about 2 nm to about 5 nm. In some embodiments, the film thickness $T_2$ of the dielectric layer 106 is in a range from about 2 nm to about 10 nm. The ratio ($T_1/T_2$) of the film thickness $T_1$ to the film thickness $T_2$ may be in a range from about 0.5 to about 1. In some embodiments, the ratio of the film thickness $T_1$ to the total width of the dielectric fin 108 may be in a range from about 0.2 to about 0.4.

In some cases where the film thickness $T_1$ of the crystallized protective layer 104' is thinner than about 2 nm, the grain growth of the crystallized protective layer 104' might be suppressed. The crystallized protective layer 104' might not be able to provide sufficient etch resistance to sustain the subsequent etching process. In some other cases where the film thickness $T_1$ of the crystallized protective layer 104' is thicker than about 5 nm, voids might be formed in the crystallized protective layer 104' since the seam would be too narrow. As a result, the seam S may be randomly merged into voids. As mentioned above, these voids may results in the unexpected merging of nearby epitaxial structures. Alternatively, the voids may result in unexpected short circuiting between two portions of a gate stack that are designed to be electrically isolated from each other.

Figure 1H:
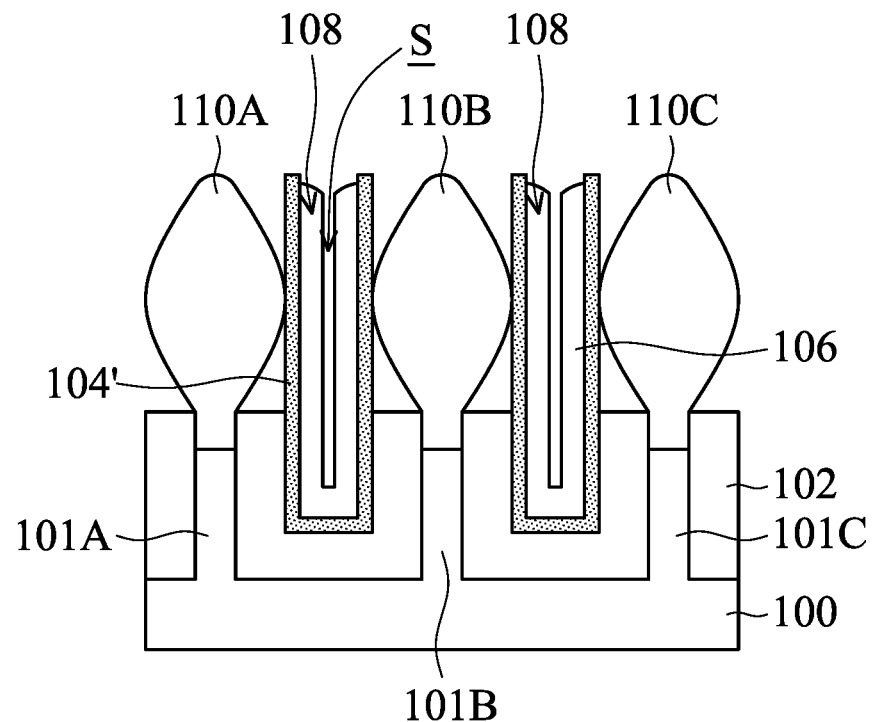

As shown in FIG. 1H, epitaxial structures 110A, 110B, and 110C are respectively formed on the recessed fin structures 101A, 110B, and 110C, in accordance with some embodiments. Due to the dielectric fins 108, each of the epitaxial structures 110A, 110B, and 110C is prevented from being merged with another nearby epitaxial structure. In some embodiments, the dielectric fins 108 are in direct contact with the nearby epitaxial structures 110A, 110B, and/or 110C.

In some embodiments, the epitaxial structures 110A to 110C are p-type semiconductor structures. For example, the epitaxial structures 110A to 110C may include epitaxially grown silicon germanium or silicon germanium doped with boron. It should be appreciated, however, that the epitaxial structures 110A to 110C are not limited to being p-type semiconductor structures.

In some embodiments, the epitaxial structures 110A to 110C are n-type semiconductor structures. The epitaxial structures 110A to 110C may include epitaxially grown silicon, epitaxially grown silicon carbide (SiC), epitaxially grown silicon phosphide (SiP), or another suitable epitaxially grown semiconductor material. Alternatively, one or two of the epitaxial structures 110A to 110C is a p-type semiconductor structure while another one is an n-type semiconductor structure.

In some embodiments, the epitaxial structures 110A to 110C are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, one or both of the epitaxial structures 110A to 110C are doped with one or more suitable dopants. For example, the epitaxial structures 110A to 110C are SiGe source/drain features doped with boron (B), indium (In), or another suitable dopant. Alternatively, in some other embodiments, one or both of the epitaxial structures 110A to 110C are Si source/drain features doped with phosphor (P), antimony (Sb), or another suitable dopant.

In some embodiments, the epitaxial structures 110A to 110C are doped in-situ during their epitaxial growth. In some other embodiments, the epitaxial structures 110A to 110C are not doped during the growth of the epitaxial structures 110A to 110C. Instead, after the formation of the epitaxial structures 110A to 110C, the epitaxial structures 110A to 110C are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 110A to 110C are further exposed to one or more annealing processes to activate the dopants. For example, a rapid thermal annealing process is used.

After the formation of the epitaxial structures 110A to 110C, a dielectric layer is deposited over the dummy gate stack and the epitaxial structures 110A to 110C. Afterwards, a planarization process is used to thin down the dielectric layer and to expose the top surface of the dummy gate stack. Then, the dummy gate stack is removed to form a trench that partially exposes the fin structures 101A to 101C and the dielectric fins 108. Afterwards, a metal gate stack is formed in the trench.

As shown in FIG. 2B, the metal gate stack includes a gate dielectric layer 126 and a metal gate electrode 128. The metal gate electrode 128 may include a work function layer and a conducive filling. In some embodiments, the formation of the metal gate stack involves the deposition of multiple metal gate stack layers over the dielectric layer to fill the trench.

In some embodiments, the gate dielectric layer 126 is made of or includes a dielectric material with high dielectric constant (high-K). The gate dielectric layer 126 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 126 may be deposited using an ALD process, a CVD process, one or more other applicable processes, or a combination thereof.

In some embodiments, before the formation of the gate dielectric layer 126, an interfacial layer is formed on the surfaces of the fin structures 101A to 101C. The interfacial layer is very thin and is made of, for example, silicon oxide or germanium oxide. In some embodiments, the interfacial layer is formed by applying an oxidizing agent on the surfaces of the fin structures 101A to 101C. For example, a hydrogen peroxide-containing liquid may be applied or provided on the surfaces of the fin structures 101A to 101C so as to grow the interfacial layer.

The work function layer may be used to provide the desired work function for transistors to enhance device performance including improved threshold voltage. In some embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 126 using an ALD process, a CVD process, a PVD process, an electroplating process, an electroless plating process, one or more other applicable processes, or a combination thereof.

In some embodiments, a barrier layer is formed before the work function layer to interface the gate dielectric layer 126 with the subsequently formed work function layer. The barrier layer may also be used to prevent diffusion between the gate dielectric layer 126 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling is made of or includes a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers that are outside of the trench, in accordance with some embodiments. As a result, the remaining portions of the metal gate stack layers form the metal gate stack, as shown in FIG. 2B.

Afterwards, an insulating structure 190 is formed in the metal gate stack, as shown in FIG. 2B in accordance with some embodiments. In some embodiments, the insulating structure 190 penetrates through the metal gate electrode 128 and the gate dielectric layer 126 to reach one of the dielectric fins 108. In some embodiments, the insulating structure 190 and the dielectric fin 108 thereunder together separate the metal gate stack into a first portion 128a and a second portion 128b, as shown in FIG. 2B. The first portion 128a and the second portion 128b are thus electrically isolated from each other. The first portion 128a and the second portion 128b that are cut from the same metal gate stack may now function as two metal gate stacks of different devices.

The insulating structure 190 may be made of or include silicon oxide, silicon nitride, silicon oxynitride, silicon carbide, carbon-containing silicon oxide, carbon-containing silicon nitride, carbon-containing silicon oxynitride, one or more other suitable materials, or a combination thereof. In some embodiments, a photolithography process and an etching process is used to partially remove the metal gate stack and to form a trench that exposes one of the dielectric fins 108. Afterwards, the insulating material used for forming the insulating structure 190 is formed to fill the trench. A planarization process may then be used to remove the portion of the insulating material outside of the trench. As a result, the remaining portion of the insulating material in the trench forms the insulating structure 190.

Figure 3A:
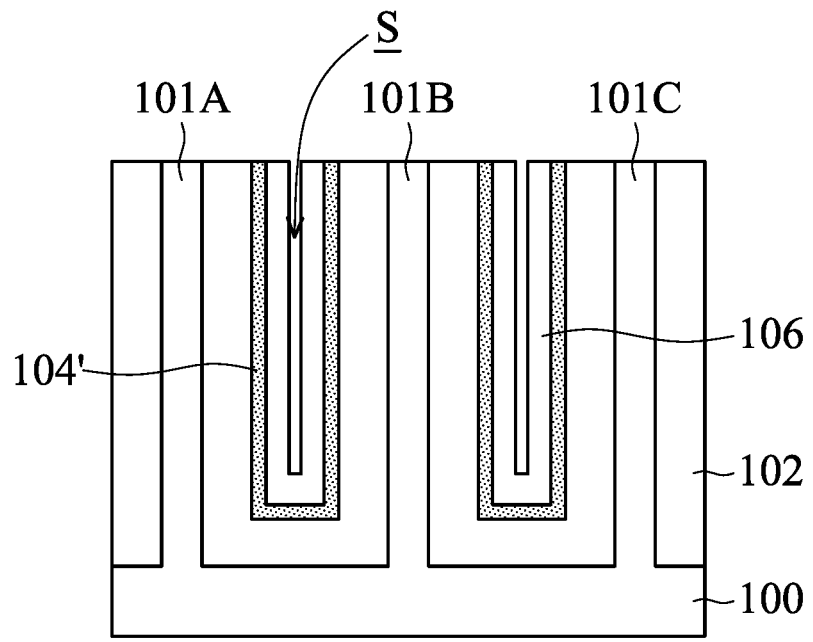
FIGS. 3A-3G are cross-sectional views of various stages of a process for forming a portion of a semiconductor device structure, in accordance with some embodiments.

Many variations and/or modifications can be made to embodiments of the disclosure. FIGS. 3A-3G are cross-sectional views of various stages of a process for forming a portion of a semiconductor device structure, in accordance with some embodiments. As shown in FIG. 3A, a structure the same as or similar to the structure shown in FIG. 1E is formed, in accordance with some embodiments.

Figure 3B:
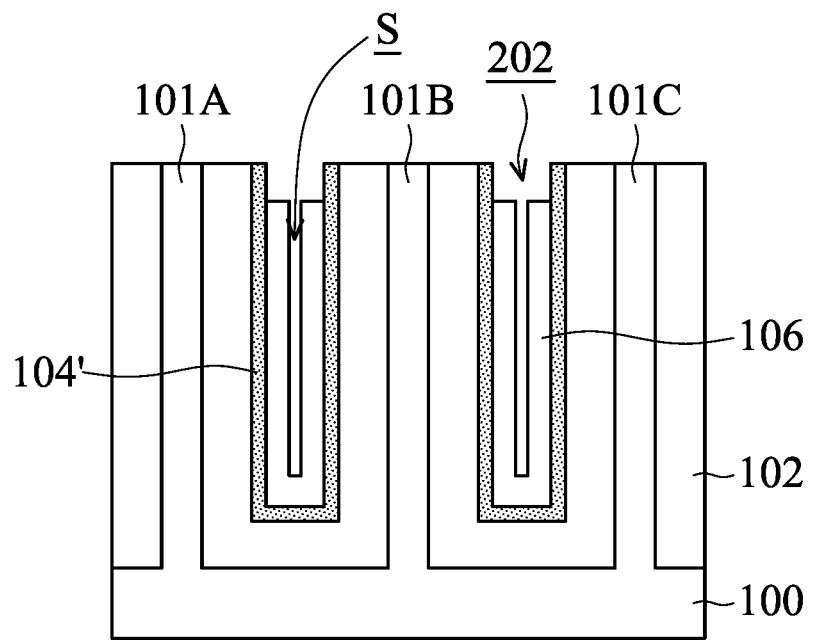

As shown in FIG. 3B, before the recessing of the isolation layer 102, the dielectric layer 106 is partially removed to form recesses 202, in accordance with some embodiments. In some embodiments, the recesses 202 connect the seam S.

Figure 3C:
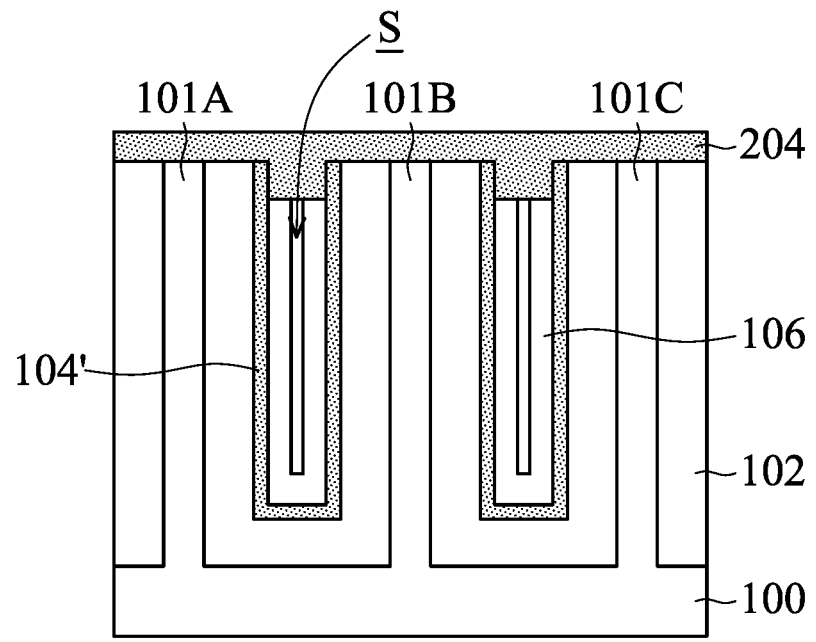

As shown in FIG. 3C, a protective material layer 204 is deposited to fill the recesses 202, in accordance with some embodiments. In some embodiments, the protective material layer 204 is made of or includes a high dielectric constant (high-k) material. The high-k material may include hafnium oxide, hafnium zirconium oxide, zirconium oxide, aluminum oxide, hafnium dioxide-alumina alloy, hafnium silicon oxide, hafnium silicon oxynitride, hafnium tantalum oxide, hafnium titanium oxide, one or more other suitable materials, or a combination thereof. The protective material layer 204 may be deposited using an ALD process, a CVD process, a flowable chemical vapor deposition (FCVD) process, one or more other applicable processes, or a combination thereof. The material and/or formation method of the protective material layer 204 may be the same as or similar to those of the protective layer 104.

Figure 3D:
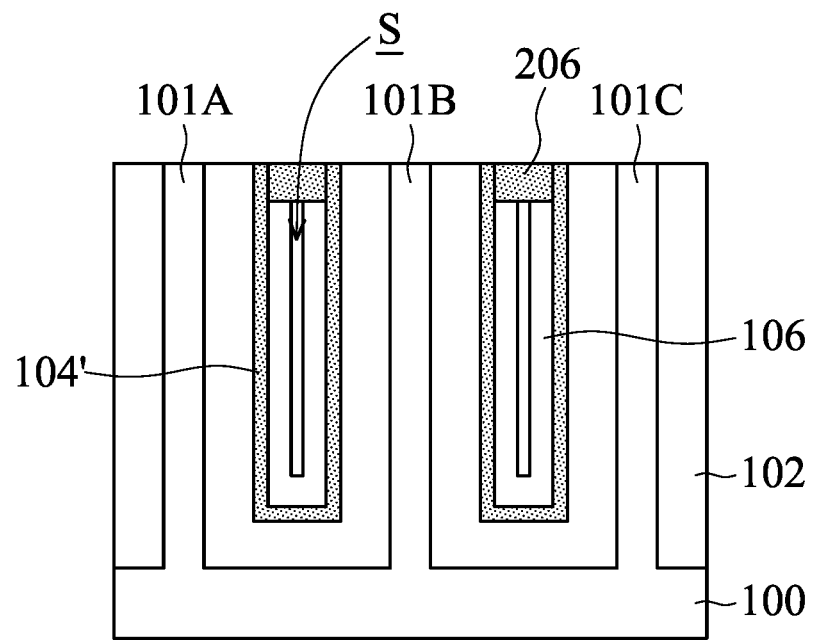

As shown in FIG. 3D, the portion of the protective material layer 204 outside of the recesses 202 is removed, in accordance with some embodiments. As a result, the remaining portions of the protective material layer 204 form protective caps 206 over the inner portions of the dielectric fins 108. In some embodiments, the seams S are sealed by the protective caps 206 and become closed holes. In some embodiments, the topmost surfaces of the protective caps 206 and the protective shells (i.e., the crystallized protective layer 104') are at substantially the same level, as shown in FIG. 3D. In some embodiments, the protective shell (i.e., the crystallized protective layer 104') extends along or covers the sidewalls of the protective cap 206, as shown in FIG. 3D.

Figure 3E:
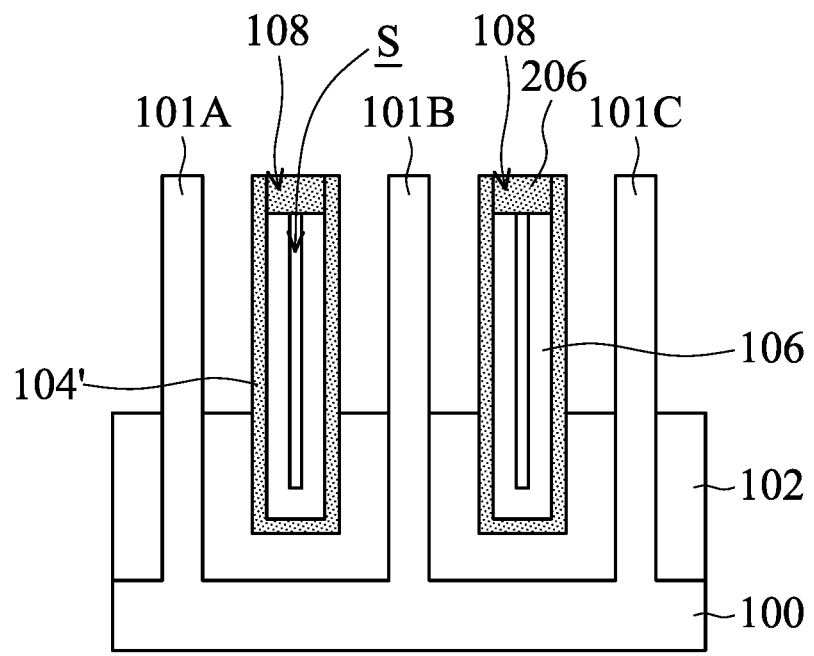

As shown in FIG. 3E, similar to the process illustrated in FIG. 1F, the isolation layer 102 is partially removed, in accordance with some embodiments. As a result, the fin structures 101A to 101C and the dielectric fins 108 protrude from the top surface of the isolation structure (i.e., the remaining portion of the isolation layer 102).

Afterwards, similar to the embodiments illustrated in FIG. 2A, a dummy gate stack is formed to partially cover the fin structures 101A to 101B and the dielectric fins 108.

Figure 3F:
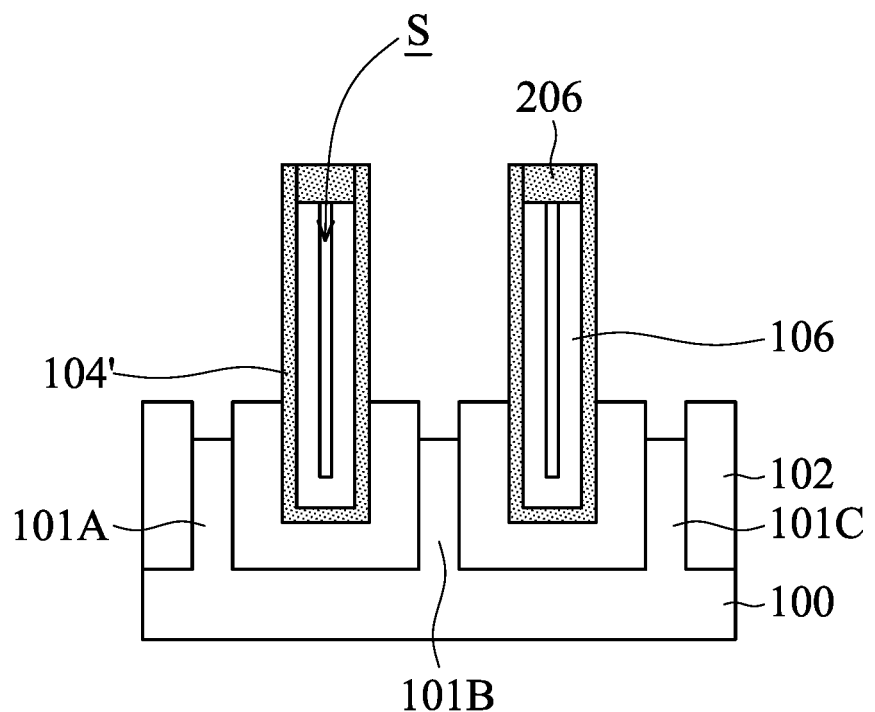

As shown in FIG. 3F, similar to the process illustrated in FIG. 1G, the portions of the fin structures 101A to 101C that are not covered by the dummy gate stack is then partially removed, in accordance with some embodiments. During the recessing of the fin structures 101A to 101C, the dielectric structure (i.e., the dielectric layer 106) of the dielectric fin 108 under the protective cap 206 is protected and prevented from being damaged by the etchant used for recessing the fin structures 101A to 101C.

In some embodiments, similar to the protective shell of the dielectric fin 108, one or more thermal operations is used to crystallize the protective cap 206, so as to enhance the etching resistance of the protective cap 206. In some embodiments, the thermal operation is performed after the deposition of the protective material layer 204. In some other embodiments, the thermal operation is performed after the formation of the protective cap 206 and before the recessing of the fin structures 101A to 101C.

Figure 3G:
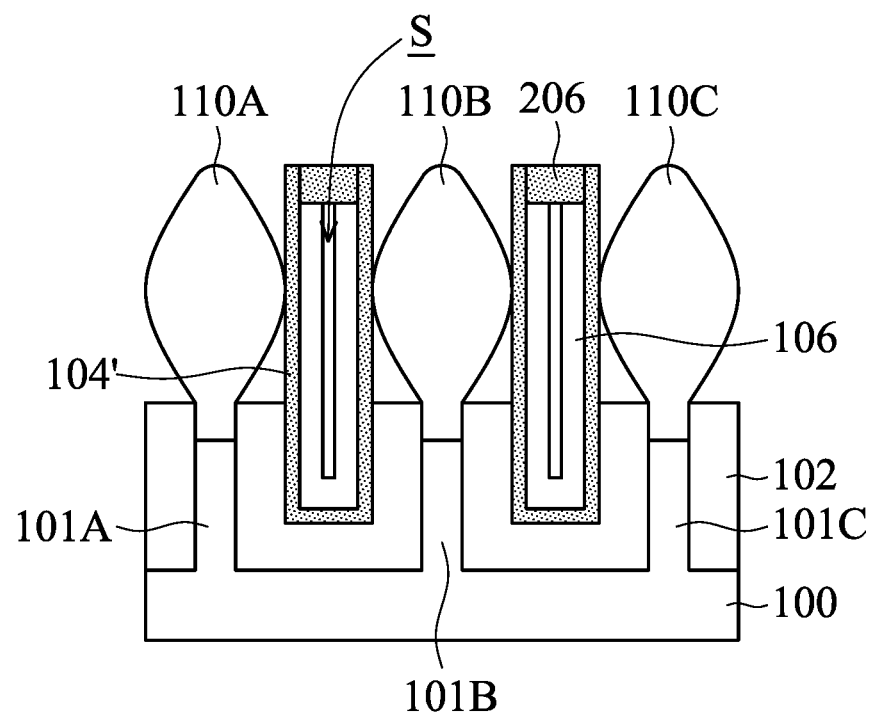

As shown in FIG. 3G, similar to the embodiments illustrated in FIG. 1H, the epitaxial structures 110A to 110C are formed, in accordance with some embodiments. Due to the dielectric fins 108, the epitaxial structures 110A to 110C are prevented from being merged together. The performance and reliability of the semiconductor device structure are ensured.

Figure 4A:
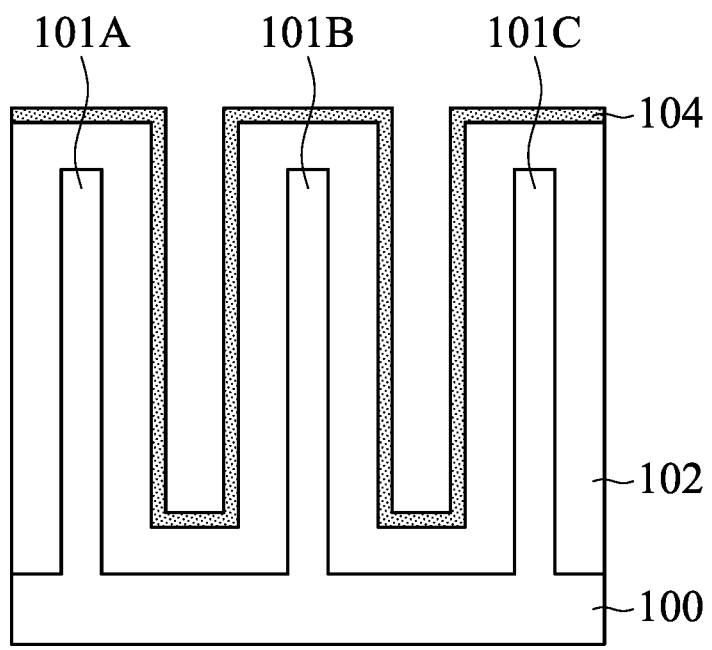
FIGS. 4A-4F are cross-sectional views of various stages of a process for forming a portion of a semiconductor device structure, in accordance with some embodiments.

Many variations and/or modifications can be made to embodiments of the disclosure. FIGS. 4A-4F are cross-sectional views of various stages of a process for forming a portion of a semiconductor device structure, in accordance with some embodiments. As shown in FIG. 4A, a structure the same as or similar to the structure shown in FIG. 1C is formed, in accordance with some embodiments.

Figure 4B:
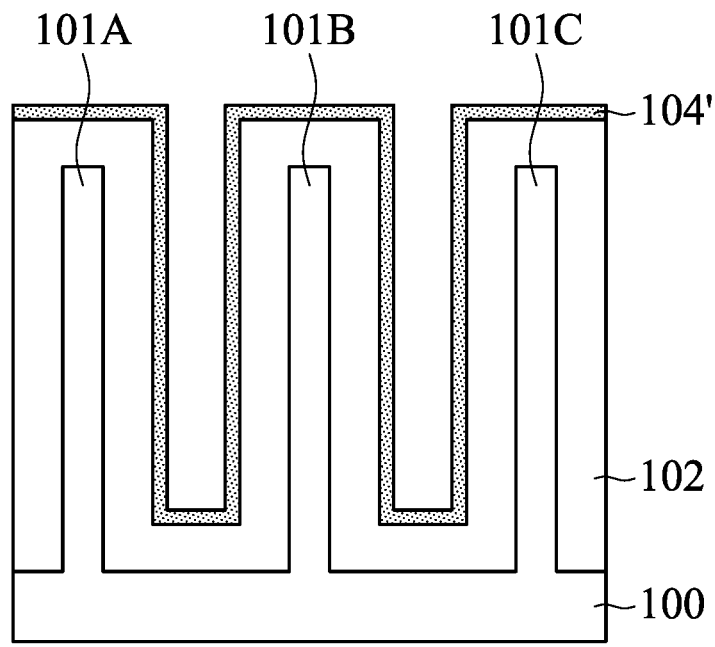

As shown in FIG. 4B, a thermal operation is used to crystallize the protective layer 104, so as to form a crystallized protective layer 104', in accordance with some embodiments.

Figure 4C:
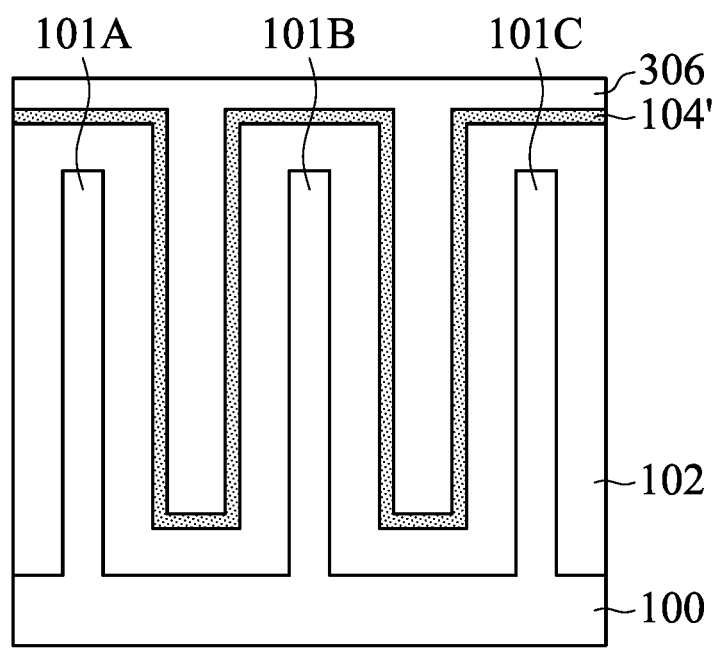

As shown in FIG. 4C, a dielectric layer 306 is deposited over the crystallized protective layer 104' to overfill the trenches, in accordance with some embodiments. The dielectric layer 306 may be made of or include silicon nitride, silicon oxide, silicon oxynitride, carbon-containing silicon oxide, carbon-containing silicon oxynitride, one or more other suitable materials, or a combination thereof. The dielectric layer 306 may be deposited using an FCVD process. In some embodiments, no seam is formed, as shown in FIG. 4C.

Figure 4D:
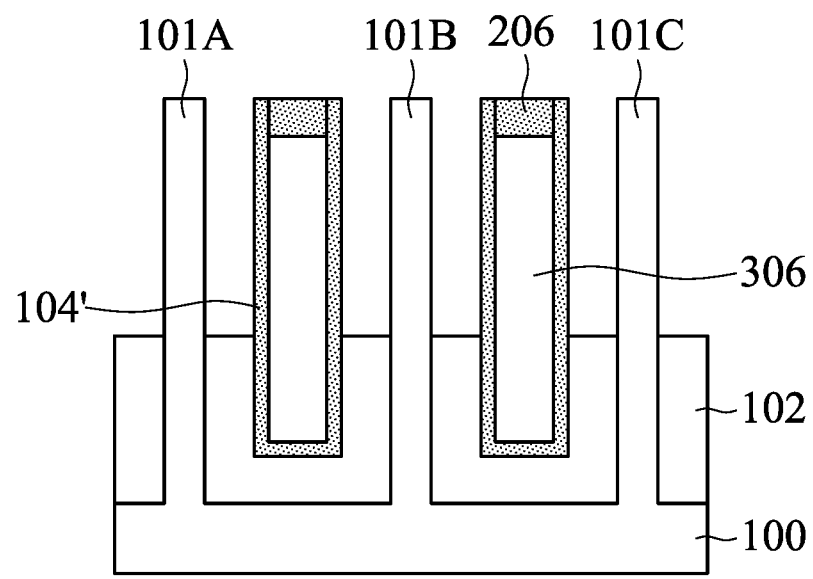

As shown in FIG. 4D, similar to the process illustrated in FIGS. 3A-3E, the protective caps 206 are formed, and the isolation layer 102 is partially removed, in accordance with some embodiments. As a result, the fin structures 101A to 101C and the dielectric fins 108 protrude from the top surface of the isolation structure (i.e., the remaining portion of the isolation layer 102).

Afterwards, similar to the embodiments illustrated in FIG. 2A, a dummy gate stack is formed to partially cover the fin structures 101A to 101B and the dielectric fins 108.

Figure 4E:
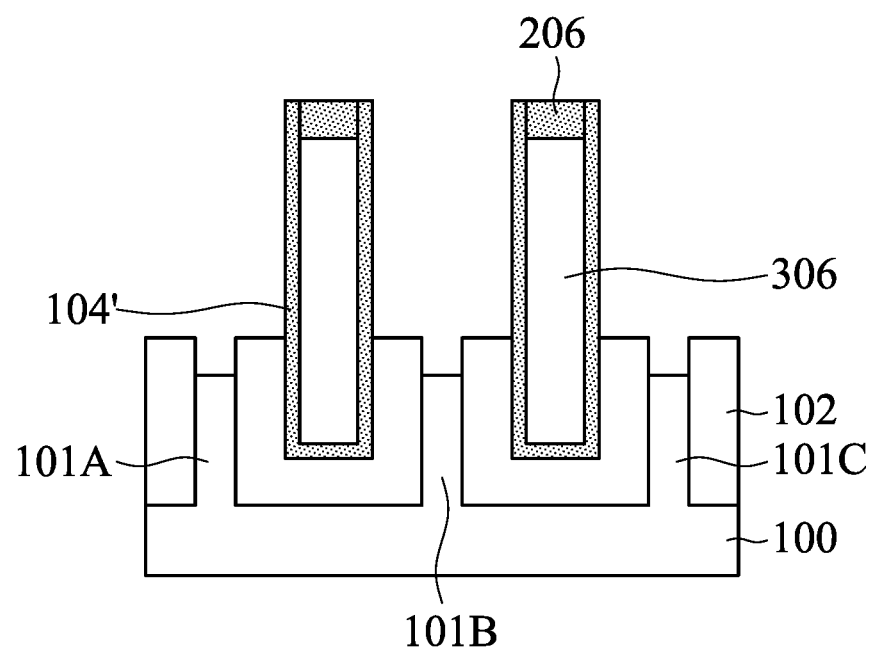

As shown in FIG. 4E, similar to the process illustrated in FIG. 1G, the portions of the fin structures 101A to 101C that are not covered by the dummy gate stack is then partially removed, in accordance with some embodiments. During the recessing of the fin structures 101A to 101C, the inner portion (i.e., the dielectric layer 306) of the dielectric fin 108 under the protective cap 206 is protected and prevented from being damaged by the etchant used for recessing the fin structures 101A to 101C.

Figure 4F:
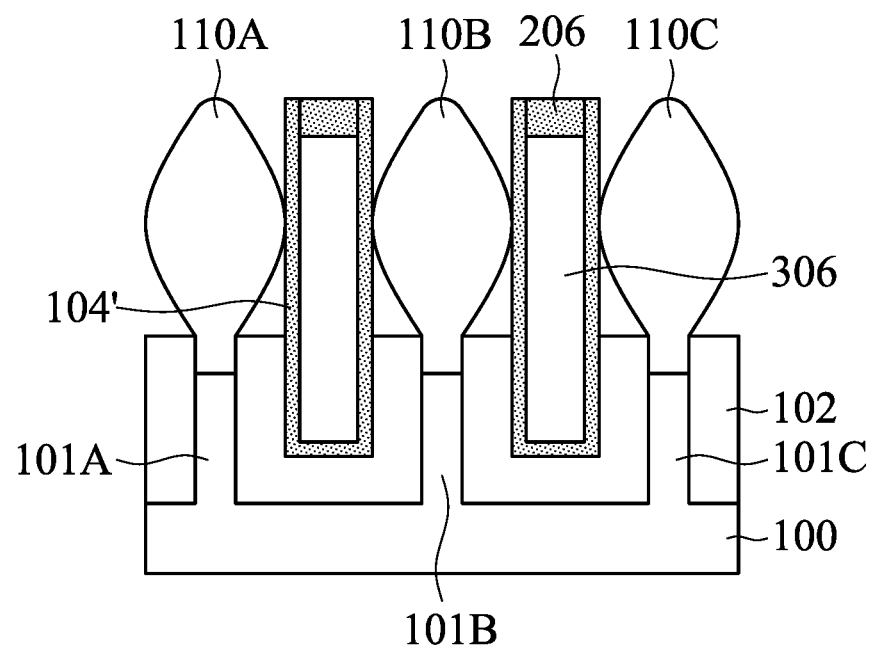

As shown in FIG. 4F, similar to the embodiments illustrated in FIG. 1H, the epitaxial structures 110A to 110C are formed, in accordance with some embodiments. Due to the dielectric fins 108, the epitaxial structures 110A to 110C are prevented from being merged together. The performance and reliability of the semiconductor device structure are ensured.

Figure 5:
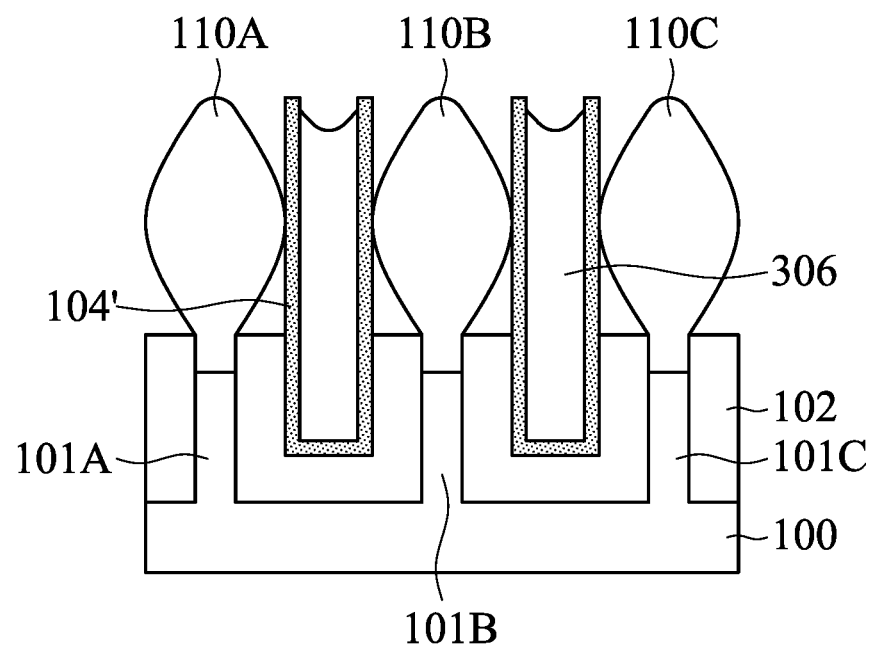
FIG. 5 is a cross-sectional view of an intermediate stage of a process for forming a portion of a semiconductor device structure, in accordance with some embodiments.

Many variations and/or modifications can be made to embodiments of the disclosure. FIG. 5 is a cross-sectional view of an intermediate stage of a process for forming a portion of a semiconductor device structure, in accordance with some embodiments. In some embodiments, no protective cap is formed over the dielectric layer 306.

In some embodiments, similar to the structure shown in FIG. 1G, the dielectric layer 306 of the dielectric fin 108 is slightly etched during the recessing of the fin structures 101A to 101C. In some embodiments, the topmost surface of the inner portion (i.e., the dielectric layer 306) of the dielectric fin 108 is closer to the semiconductor substrate 100 than the topmost surface of the crystallized protective layer 104' (that functions as a protective shell) of the dielectric fin 108. In some embodiments, the topmost surface of the inner portion (i.e., the dielectric layer 306) has a curved profile. In some embodiments, the topmost surface of the inner portion (i.e., the dielectric layer 306) has convex profile facing downwards, as shown in FIG. 5.

Embodiments of the disclosure form a semiconductor device structure with dielectric fins. The dielectric fin has a protective shell that extends along sidewalls and a bottom of a dielectric structure. The protective shell may be a crystallized high-k material that has a better etching resistance than the inner portion (i.e., the dielectric structure) of the dielectric fin. The protective shell ensures the structural stability of the dielectric fin. Due to the blocking of the dielectric structure, the seam surrounded by the protective shell is prevented from being merged to form voids through the protective shell. The reliability and performance of the semiconductor device structure are improved.

In accordance with some embodiments, a semiconductor device structure is provided. The semiconductor device structure includes a first fin structure and a second fin structure over a semiconductor substrate. The semiconductor device structure also includes a first epitaxial structure over the first fin structure and a second epitaxial structure over the second fin structure. The semiconductor device structure further includes a dielectric fin over the semiconductor substrate, and the dielectric fin is between the first fin structure and the second fin structure. The dielectric fin has an inner portion and a protective layer, and the protective layer extends along sidewalls and a bottom of the inner portion. The protective layer has a dielectric constant higher than that of silicon nitride.

In accordance with some embodiments, a semiconductor device structure is provided. The semiconductor device structure includes an epitaxial structure over a semiconductor substrate. The semiconductor device structure also includes a dielectric fin over the semiconductor substrate. The dielectric fin extends upwards to exceed a bottom surface of the epitaxial structure. The dielectric fin has a dielectric structure and a protective shell, and the protective shell extends along sidewalls and a bottom of the dielectric structure. The protective shell has a first average grain size, and the dielectric structure has a second average grain size. The first average grain size is larger than the second average grain size.

In accordance with some embodiments, a method for forming a semiconductor device structure is provided. The method includes forming a fin structure over a semiconductor substrate and forming an isolation layer over the fin structure and the semiconductor substrate. The method also includes forming a protective layer over the isolation layer and forming a dielectric layer over the protective layer. The method further includes partially removing the isolation layer, the protective layer, and the dielectric layer. A remaining portion of the isolation layer forms an isolation structure, and remaining portions of the protective layer and the dielectric layer form a dielectric fin. The isolation structure laterally surrounds a lower portion of the fin structure and a lower portion of the dielectric fin. The protective shell has a first average grain size, the dielectric structure has a second average grain size, and the first average grain size is larger than the second average grain size.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first fin structure and a second fin structure over a semiconductor substrate;
   a first epitaxial structure over the first fin structure;
   a second epitaxial structure over the second fin structure; and
   a dielectric fin over the semiconductor substrate, wherein the dielectric fin is between the first fin structure and the second fin structure, the dielectric fin has an inner portion and a protective layer, the protective layer extends along sidewalls and a bottom of the inner portion, the protective layer has a dielectric constant higher than that of the inner portion, the protective layer has a first average grain size, the inner portion has a second average grain size, and the first average grain size is larger than the second average grain size, and a topmost surface of the inner portion is vertically higher than a bottommost surface of the first epitaxial structure.

2. The semiconductor device structure as claimed in claim 1, wherein the dielectric constant of the protective layer is higher than that of silicon nitride.

3. The semiconductor device structure as claimed in claim 1, wherein the first epitaxial structure is in direct contact with the protective layer of the dielectric fin.

4. The semiconductor device structure as claimed in claim 1, wherein the first epitaxial structure and the second epitaxial structure are in direct contact with the protective layer of the dielectric fin.

5. The semiconductor device structure as claimed in claim 1, further comprising an isolation structure over the semiconductor substrate, wherein the isolation structure laterally surrounds a lower portion of the dielectric fin.

6. The semiconductor device structure as claimed in claim 5, further comprising a seam extending downwards from a top surface of the inner portion of the dielectric fin to exceed a topmost surface of the isolation structure.

7. The semiconductor device structure as claimed in claim 6, further comprising a protective cap over the inner portion of the dielectric fin, wherein the protective cap seals the seam, and topmost surfaces of the protective cap and the protective layer are substantially level with each other.

8. The semiconductor device structure as claimed in claim 1, further comprising a protective cap over the inner portion of the dielectric fin, wherein the protective layer extends along sidewalls of the protective cap.

9. The semiconductor device structure as claimed in claim 1, further comprising:
   a gate stack covering a portion of the dielectric fin; and
   an insulating structure connected to the dielectric fin, wherein the insulating structure and the dielectric fin together separate the gate stack into a first portion and a second portion, and the first portion and the second portion are electrically isolated from each other.

10. A semiconductor device structure, comprising:
    an epitaxial structure over a semiconductor substrate; and
    a dielectric fin over the semiconductor substrate, wherein the dielectric fin extends upwards to exceed a bottom surface of the epitaxial structure, the dielectric fin has a dielectric structure and a protective shell, the protective shell extends along sidewalls and a bottom of the dielectric structure, the protective shell has a first average grain size, the dielectric structure has a second average grain size, the first average grain size is larger than the second average grain size, and topmost surfaces of the dielectric structure and the protective shell are separated from the semiconductor substrate by different distances.

11. The semiconductor device structure as claimed in claim 10, wherein the protective shell has a first dielectric constant, the dielectric structure has a second dielectric constant, and the first dielectric constant is higher than the second dielectric constant.

12. The semiconductor device structure as claimed in claim 10, wherein the epitaxial structure is in direct contact with the dielectric fin.

13. The semiconductor device structure as claimed in claim 10, wherein the protective shell has an outer sidewall and an inner sidewall, the inner sidewall is between the outer sidewall and the dielectric structure, and a lateral distance between the inner sidewall and the outer sidewall is in a range from about 2 nm to about 5 nm.

14. The semiconductor device structure as claimed in claim 10, further comprising a metal gate stack partially covering the dielectric fin, wherein the metal gate stack has a first portion and a second portion, the first portion and the second portion are electrically isolated from each other, and the dielectric fin is between the first portion and the second portion.

15. The semiconductor device structure as claimed in claim 14, further comprising an insulating structure between the first portion and the second portion, wherein the insulating structure is in direct contact with the dielectric fin.

16. The semiconductor device structure as claimed in claim 10, further comprising a protective cap over the dielectric structure, wherein the protective shell covers sidewalls of the protective cap.

17. A semiconductor device structure, comprising:
    a first fin structure and a second fin structure over a semiconductor substrate;
    a dielectric fin between the first fin structure and the second fin structure, wherein the dielectric fin has an inner portion and a protective shell, the protective shell extends along opposite sidewalls of the inner portion, the protective shell has a dielectric constant higher than that of the inner portion, the protective shell has a first average grain size, the inner portion has a second average grain size, and the first average grain size is larger than the second average grain size;
    a seam extending downwards from a top surface of the inner portion of the dielectric fin; and
    a metal gate stack laterally surrounding the dielectric fin, the first fin structure, and the second fin structure.

18. The semiconductor device structure as claimed in claim 17, further comprising a second dielectric fin over the semiconductor substrate, wherein the second fin structure is between the dielectric fin and the second dielectric fin.

19. The semiconductor device structure as claimed in claim 18, further comprising an insulating structure penetrating through the metal gate stack and reaching the second dielectric fin.

20. The semiconductor device structure as claimed in claim 17, further comprising:

a protective cap extending across the seam, wherein the protective shell extends along sidewalls of the protective cap.

* * * * *